(12) United States Patent
Zhang et al.

(10) Patent No.: US 8,315,117 B2
(45) Date of Patent: Nov. 20, 2012

(54) INTEGRATED CIRCUIT MEMORY HAVING ASSISTED ACCESS AND METHOD THEREFOR

(75) Inventors: Shayan Zhang, Austin, TX (US); Troy L. Cooper, Austin, TX (US); Jack M. Higman, Austin, TX (US); Prashant U. Kenkare, Austin, TX (US); Andrew C. Russell, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 329 days.

(21) Appl. No.: 12/414,761

(22) Filed: Mar. 31, 2009

(65) Prior Publication Data

US 2010/0246298 A1 Sep. 30, 2010

(51) Int. Cl.
*G11C 29/00* (2006.01)
(52) U.S. Cl. .......... 365/201; 365/200; 365/226
(58) Field of Classification Search .......... 365/201, 365/200, 226, 185.09, 205, 207, 189.11, 365/189.12
See application file for complete search history.

(56) References Cited

U.S. PATENT DOCUMENTS

| | | | |
|---|---|---|---|
| 4,085,175 A | 4/1978 | Keuchel | |
| 5,159,571 A * | 10/1992 | Ito et al. | 365/201 |
| 5,298,816 A | 3/1994 | Kaplinsky | |
| 5,428,574 A * | 6/1995 | Kuo et al. | 365/201 |
| 5,430,679 A | 7/1995 | Hiltebeitel et al. | |
| 6,272,670 B1 | 8/2001 | Van Myers et al. | |
| 6,335,900 B1 | 1/2002 | Kwon et al. | |
| 6,373,758 B1 * | 4/2002 | Hughes et al. | 365/200 |
| 6,757,204 B2 | 6/2004 | Di Ronza et al. | |
| 6,765,428 B2 | 7/2004 | Kim et al. | |
| 6,788,566 B1 | 9/2004 | Bhavnagarwala et al. | |
| 6,791,864 B2 | 9/2004 | Houston | |
| 7,042,776 B2 | 5/2006 | Canada et al. | |
| 7,079,426 B2 | 7/2006 | Zhang et al. | |
| 7,085,175 B2 | 8/2006 | Remington et al. | |
| 7,193,901 B2 | 3/2007 | Ruby et al. | |
| 7,215,176 B2 | 5/2007 | Abe | |
| 7,263,027 B2 | 8/2007 | Kim et al. | |
| 7,292,495 B1 | 11/2007 | Kenkare et al. | |
| 7,333,357 B2 | 2/2008 | Houston | |
| 7,333,385 B2 | 2/2008 | Yamaoka et al. | |
| 7,411,815 B2 | 8/2008 | Gogl | |

(Continued)

OTHER PUBLICATIONS

U.S. Appl. No. 12/414,758, Inventor Zhang, et al., Integrated Circuit Having an Embedded Memory and Method for Testing the Memory, Non-Final Office Action—Rejection, dated Feb. 3, 2011.

(Continued)

*Primary Examiner* — Pho M Luu
*Assistant Examiner* — Thao Bui

(57) ABSTRACT

A memory and method for access the memory are provided. A first test is used to test memory elements to determine a lowest power supply voltage at which all the memory elements will operate to determine a weak memory element. Redundancy is used to substitute a redundant memory element for the weak memory element. The weak memory element is designated as a test element. In response to receiving a request to change a power supply voltage provided to the memory elements, a second test is used to test the test element to determine if the test element will function correctly at a new power supply voltage. If the test element passes the second test, the memory elements are accessed at the new power supply voltage. If the test element fails the second test, the memory elements are accessed using an access assist operation.

19 Claims, 4 Drawing Sheets

U.S. PATENT DOCUMENTS

| | | | |
|---|---|---|---|
| 7,443,374 | B2 | 10/2008 | Hudson |
| 7,502,275 | B2 | 3/2009 | Nii et al. |
| 7,542,369 | B2 | 6/2009 | Kenkare et al. |
| 7,570,525 | B2* | 8/2009 | Nii et al. ............... 365/189.11 |
| 7,573,762 | B2 | 8/2009 | Kenkare et al. |
| 7,603,592 | B2 | 10/2009 | Sekiguchi et al. |
| 7,613,052 | B2 | 11/2009 | Van Winkelhoff et al. |
| 7,660,150 | B2 | 2/2010 | Mikan, Jr. et al. |
| 7,692,974 | B2 | 4/2010 | Amirante et al. |
| 7,701,755 | B2 | 4/2010 | Chen et al. |
| 7,733,686 | B2 | 6/2010 | Clinton |
| 7,793,172 | B2 | 9/2010 | Bruce et al. |
| 7,864,617 | B2 | 1/2011 | Kenkare |
| 7,903,483 | B2 | 3/2011 | Russell et al. |
| 8,004,907 | B2 | 8/2011 | Russell et al. |
| 8,009,500 | B2 | 8/2011 | Nii et al. |
| 2004/0153732 | A1* | 8/2004 | Kamata .............................. 714/6 |
| 2005/0036371 | A1* | 2/2005 | Kushida ....................... 365/201 |
| 2005/0138537 | A1 | 6/2005 | Worley |
| 2006/0186935 | A1 | 8/2006 | Hwang et al. |
| 2006/0239068 | A1 | 10/2006 | Boemler |
| 2007/0025167 | A1* | 2/2007 | Ziegelmayer et al. ........ 365/201 |
| 2007/0262890 | A1 | 11/2007 | Cornwell et al. |
| 2007/0285986 | A1* | 12/2007 | Eguchi et al. ............ 365/185.22 |
| 2008/0082873 | A1 | 4/2008 | Russell et al. |
| 2008/0091990 | A1 | 4/2008 | Bruce et al. |
| 2008/0172523 | A1 | 7/2008 | Tanaka et al. |
| 2010/0208536 | A1 | 8/2010 | Deng et al. |
| 2010/0259285 | A1 | 10/2010 | Koli et al. |

OTHER PUBLICATIONS

Wang et al; "Canary Replica Feedback for Near-DRV Standby Vdd Scaling in a 90nm SRAM"; IEEE 2007 Custom Integrated Circuits Conference, pp. 29-32.

Unpublished U.S. Appl. No. 12/164,755, filed Jun. 30, 2008, entitled "Memory Operation Testing", first named inventor Shayan Zhang, and assigned to Freescale Smeiconductor, Inc.

U.S. Appl. No. 12/275,622 Office Action—Rejection, dated Apr. 2, 2010.

U.S. Appl. No. 12/275,622 Office Action—Notice of Allowance, dated Sep. 17, 2010.

U.S. Appl. No. 12,275,622 Office Action—Notice of Allowance, dated Nov. 30, 2010.

U.S. Appl. No. 12/275,622 Office Action—Notice of Allowance, dated Jun. 2, 2011.

U.S. Appl. No. 12/414,758 Office Action—Rejection, dated Feb. 3, 2011.

U.S. Appl. No. 12/414,758 Office Action—Notice of Allowance, dated Jun. 6, 2011.

U.S. Appl. No. 12/414,758 Office Action—Notice of Allowance, dated Jul. 26, 2011.

U.S. Appl. No. 12/414,758 Office Action—Notice of Allowance, dated Nov. 3, 2011.

U.S. Appl. No. 12/433,330 Office Action—Rejection, dated May 26, 2011.

U.S. Appl. No. 12/433,330 Office Action—Notice of Allowance, dated Sep. 23, 2011.

U.S. Appl. No. 11/847,424, Inventor Matthew S. Berens, et al., filed Aug. 30, 2007.

U.S. Appl. No. 12/388,911, Office Action—Notice of Allowance—dated Sep. 9, 2010.

U.S. Appl. No. 12/433,330, Office Action—Notice of Allowance—dated Feb. 6, 2012.

U.S. Appl. No. 12/433,330, "Integrated Circuit HavingMemory Repair Information Storage and Method Therefor", Inventor, Kenkare, P., et al., Office Action dated May 25, 2012.

* cited by examiner

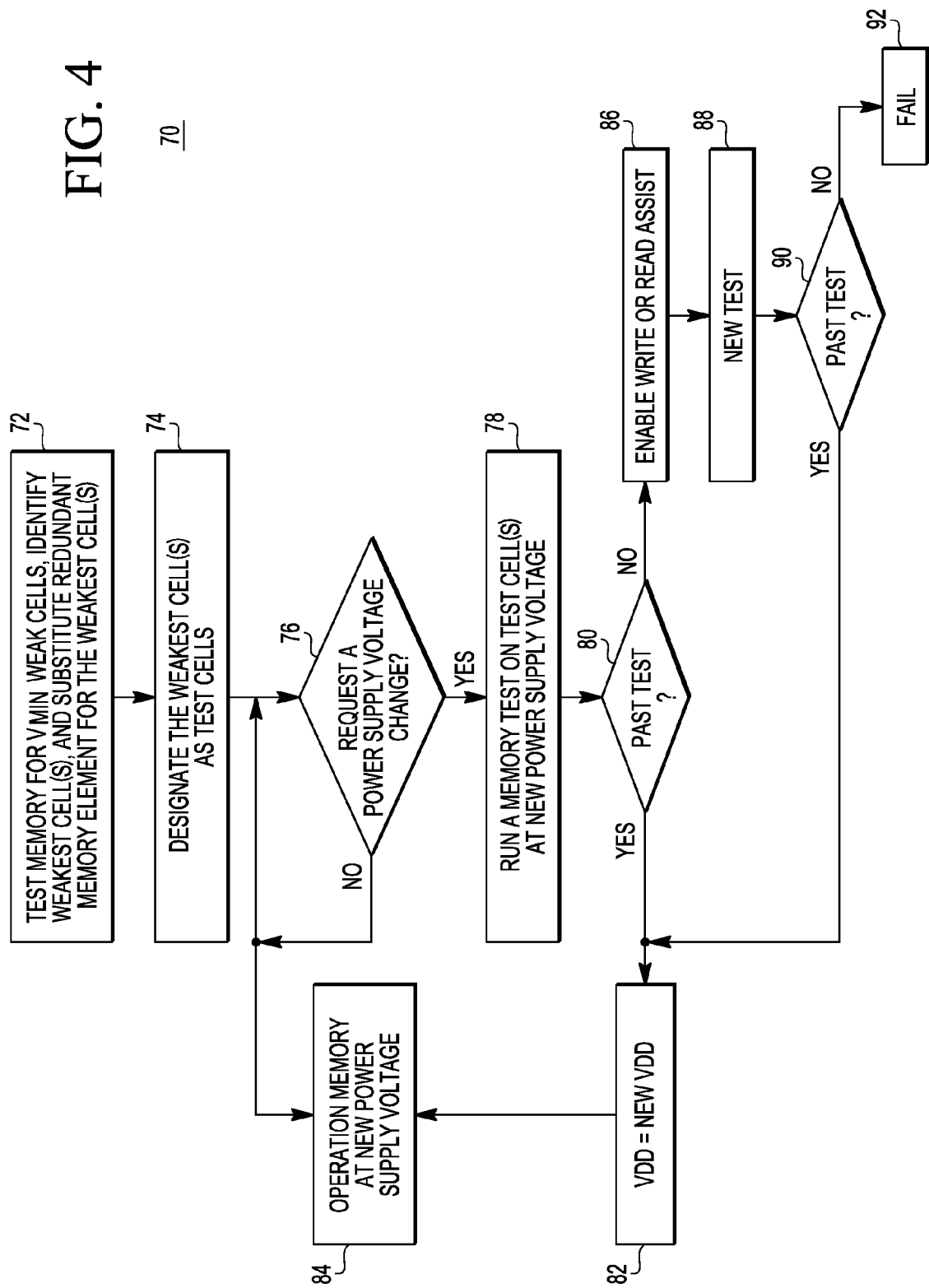

INTEGRATED CIRCUIT MEMORY HAVING ASSISTED ACCESS AND METHOD THEREFOR

CROSS-REFERENCE TO RELATED APPLICATION(S)

This application is related to U.S. patent application Ser. No. 12/275,622, filed on Nov. 21, 2008, entitled "Integrated Circuit Having Memory with Configurable Read/Write Operations and Method Therefor", by Russell et al., and assigned to the current assignee hereof.

This application is related to U.S. patent application Ser. No. 12/414,758, filed on even date, entitled "Integrated Circuit Having an Embedded Memory and Method for Testing the Memory", by Zhang et al., and assigned to the current assignee hereof.

BACKGROUND

1. Field

This disclosure relates generally to integrated circuit memories, and more specifically, to an integrated circuit memory having assisted access and method therefor.

2. Related Art

One of the most common ways to reduce power consumption in integrated circuits is to lower the power supply voltage. However, lowering the power supply voltage can cause increased failures and unreliable operation in some circuits. For example, the lowest power supply voltage (VMIN) on which a SoC (system-on-a-chip) can operate is often limited by the memory arrays embedded on the SoC. The embedded memories typically require a large built-in speed/reliability guard band margin to cover device mismatches. Device mismatches may be caused by, for example, random dopant fluctuations, negative bias temperature instability, and hot carrier injection. The problem is made worse as transistor sizes are decreased.

Therefore, what is needed is an integrated circuit and method for solving the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 illustrates a flow chart of a method for testing a memory in accordance with an embodiment.

DETAILED DESCRIPTION

Figure 1:
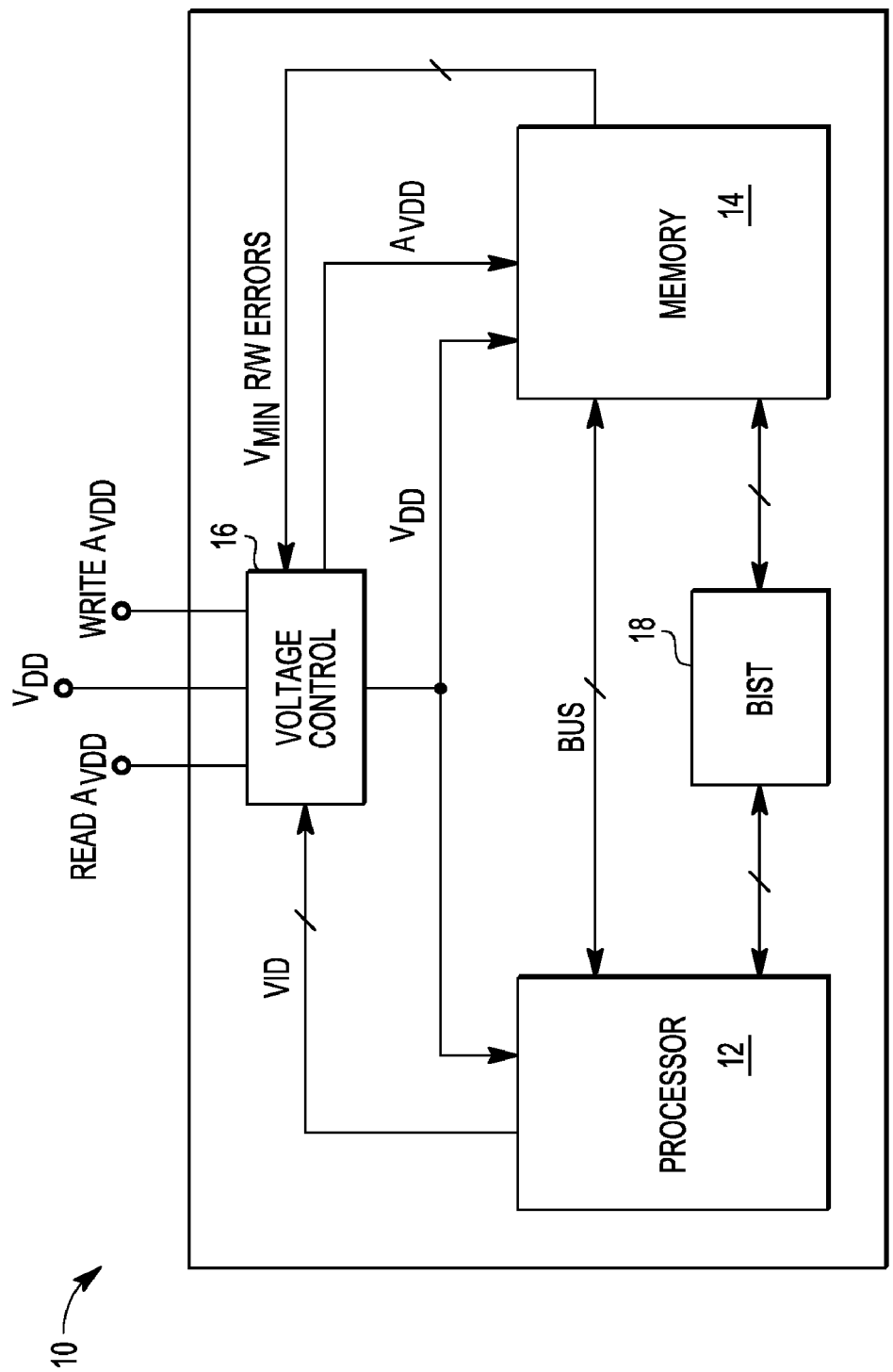
FIG. 1 illustrates, in block diagram form, a system in accordance with an embodiment.

Generally, there is provided, a embedded memory array and a method for accessing the memory array. Test circuits are included on an integrated circuit SoC having the embedded memory array for determining the minimum supply voltage at which memory cells of the memory array will operate reliably. In one embodiment, one of the memory cells may fail at a power supply voltage that is relatively higher than a power supply voltage at which the other memory cells fail. That memory cell is designated as a test memory cell. The test memory cell may be among the weakest cells of the array and is assumed to be one of the first to fail when the power supply voltage is lowered. A redundant memory cell is used to substitute for the test memory cell during normal write and read accesses to the memory array. The location of the test memory cell, the voltage at which it failed, and other information regarding the memory cell is stored. The designated test cell is used to predict when memory operation will become unreliable because of an inadequate power supply voltage. The test memory cell is tested each time the power supply voltage to the array is changed to ensure that the memory cells of the array continue to operate reliably at the new power supply voltage. In one embodiment, the test cell is tested anytime the power supply voltage is lowered. In another embodiment, the test cell is tested following a power on reset (POR) or power up. The error detection circuit includes a multiplexer and a comparator circuit coupled to bit lines of the array. The multiplexer is used to allow the logic state of the test cell to be compared with another memory cell during a read test or with an input data signal during a write test. When necessary, an access assist operation is performed to assist accessing of the memory array during a read or write access to the memory array. The access assist operation may include changing the power supply voltage to the array during accessing, or in the case of a write access, changing the bit line voltage to a negative voltage. The error detection circuit and test cell together provide a technique for determining a minimum operating voltage of the memory. Also, using one of the normal memory cells as the test cell provides more accurate local determination of the minimum power supply voltage than a memory that uses a special set of memory cells outside of the array.

In one aspect, there is provided, a method comprising: testing, using a first test, a plurality of memory elements to determine a lowest power supply voltage at which all the plurality of memory elements will operate; determining a weak memory element of the plurality of memory elements; substituting a portion of a plurality of redundant memory elements for a portion of the plurality of memory elements that includes the weak memory element; designating the weak memory element to be a test element; supplying the plurality of memory elements with a first power supply voltage; receiving a request for a change of the first power supply voltage to a second power supply voltage; in response to receiving the request, testing, using a second test, the test element to determine if the test element will function correctly at the second power supply voltage, if the test element passes the second test, accessing the plurality of memory elements at the second power supply voltage, and if the test element fails the second test, accessing the plurality of memory elements using an access assist operation. The weak memory element may be one of either a memory cell, a plurality of memory cells, a row of memory cells, and a column of memory cells. The access assist operation may comprise one of either using the first power supply voltage during the accessing of the plurality of memory elements, accessing the plurality of memory elements using a predetermined power supply voltage determined using the first test, applying a negative voltage to a bit line during the accessing of the plurality of memory elements, and applying a third power supply voltage determined during a third test during the accessing of the plurality of memory elements. Substituting the portion of the plurality of redundant memory cells for the portion of the plurality of memory cells that includes the weak memory element may further comprise substituting a column of the plurality of redundant memory elements for a column of the plurality memory elements that includes the weak memory element. Designating the weak memory element to be a test element may further comprise using the test element only as a test element. The plurality of memory elements may comprise a plurality of static random access memory cells. Accessing the plurality of memory elements at the third power supply voltage may further comprise providing the third power supply voltage for only for the duration of the access. The method may further comprise supplying the plurality of memory elements with the second power supply voltage after the access is complete. The plurality of memory elements may be characterized as being part of an embedded memory in a single-chip data processing system. The first test may be characterized as being a built-in self test, and the second and third tests are characterized as being performed during a functional operating mode of the plurality of memory elements.

In another aspect, there is provided, a method for accessing a memory array comprising: implementing redundancy in the memory array to substitute a redundant memory cell for a failed memory cell; testing, using a first test, the memory array to determine a lowest power supply voltage at which all memory cells of the memory array will operate; determining a weak memory cell of the memory array; substituting a redundant memory cell for the weak memory cell; designating the weak memory cell to be only a test cell; supplying the memory array with a first power supply voltage; receiving a request for a change of the first power supply voltage to a second power supply voltage; in response to receiving the request, testing, using a second test, the test cell to determine if both read and write operations can be performed correctly on the test cell at the second power supply voltage, if the test cell passes the second test, accessing the memory array at the second power supply voltage, and if the test cell fails the second test, providing a third power supply voltage to the test cell and testing the test cell using a third test to determine if the test cell will function correctly at the third power supply voltage; and if the test cell passes the third test, accessing the memory array at the third power supply voltage. The second and third power supply voltages may be generated on a same integrated circuit as the memory array. Substituting a redundant memory cell for the weak memory cell may further comprise substituting a redundant column of memory cells for a column of memory cells having the weak memory cell. The plurality of memory cells may comprise a plurality of static random access memory cells. Accessing the memory array at the third power supply voltage may further comprise providing the third power supply voltage for only for the duration of the access. The plurality of memory cells may be characterized as being part of an embedded memory in a single-chip data processing system.

In yet another aspect, there is provided, an integrated circuit comprising: a memory array comprising a plurality of memory cells organized in rows and columns, wherein a memory cell of the plurality of memory cells is designated as a test memory cell; a plurality of redundant memory cells for implementing redundancy in the memory array, wherein a redundant memory cell of the plurality of redundant memory cells is used to substitute for the test memory cell during operation of the integrated circuit; an error detection circuit, coupled to the memory array, for detecting a failure of the test memory cell concurrently with an access to a memory cell of the plurality of memory cells; and a voltage control circuit, coupled to the memory array and to the error detection circuit, for changing activating an access assist operation in response to the error detection circuit detecting a failure of the test memory cell. The test memory cell may be characterized as being a memory cell of the memory array that operates unreliably at a relatively high power supply voltage. The error detection circuit may provide an access error signal to the voltage control circuit in response to detecting the failure of the test memory cell, and the voltage control circuit may change one of either the power supply voltage to the memory array or a bit line voltage in response to the access error signal. The voltage control circuit may comprise a comparator having a first input coupled to a first bit line, a second input coupled to a second bit line, and an output coupled to an input of the error detection circuit.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

FIG. 1 illustrates, in block diagram form, an integrated circuit 10 in accordance with an embodiment. Integrated circuit 10 includes a processor 12, memory 14, voltage control 16, and built-in self-test block (BIST) 18. Processor 12 and memory 14 are bidirectionally coupled together using a plurality of conductors labeled "BUS". Voltage control 16 has a first power supply terminal for receiving a power supply voltage labeled "VDD", a second power supply voltage terminal for receiving a power supply voltage labeled "READ AVDD", and a third power supply voltage terminal for receiving a power supply voltage labeled "WRITE AVDD". In one embodiment, VDD, READ VDD, and WRITE VDD are generated externally to integrated circuit 10. In other embodiment, VDD, READ VDD, and WRITE VDD are generated internally. Also, the voltages VDD, READ AVDD and WRITE AVDD may be fixed or variable depending on the embodiment. Both processor 12 and memory 14 include a first power supply voltage terminal for receiving a power supply voltage from voltage control 16 labeled "VDD". Also, memory 14 includes a second power supply voltage terminal for receiving an array power supply voltage labeled "AVDD" and outputs for providing VMIN read and write error signals labeled "VMIN R/W ERRORS". In one embodiment, memory 14 is a memory coupled to provide or receive instructions, addresses, or data in response to access requests from processor 12. In another embodiment, memory 14 may be a level 1 (L1) or level 2 (L2) cache consisting of data, tag, and status memory blocks as well as control logic. As discussed herein, a voltage VMIN is the lowest power supply voltage that will allow a memory cell to function correctly and reliably. The voltage VMIN may be different for different cells in the array depending on, for example, device mismatches that may cause one memory cell to have a different VMIN than other cells of the array. Device mismatches may be caused by, for example, random dopant fluctuations, negative bias temperature instability, and hot carrier injection. Typically, a large built-in speed/reliability guard band power supply margin is built in to cover reliability issues caused by device mismatches.

Both of power supply voltages VDD and AVDD provided by voltage control 16 are adjustable. A magnitude of power supply voltage VDD is determined by processor 12. Processor 12 provides a digital voltage identifier labeled "VID" to an input of voltage control 16. In response to the voltage identifier VID, voltage control 16 provides power supply voltage VDD with a predetermined magnitude. Voltage control 16 may include one or more voltage regulators for accurately regulating the power supply voltages. Thus, processor 12 can change the power supply voltage to circuit blocks of integrated circuit 10 depending on, for example, the operating mode of processor 12. For example, during a low power operating mode, processor 12 can assert an appropriate voltage identifier VID to lower power supply voltage VDD to reduce power consumption of integrated circuit 10. In addition, during a self-test mode, BIST 18 can change voltage identifier VID to provide the ability to test memory 14 at various power supply voltages. In another embodiment, a portion of the voltage control 16 can be included within memory 14. The operation of memory 14 will be discussed below in more detail.

Figure 2:
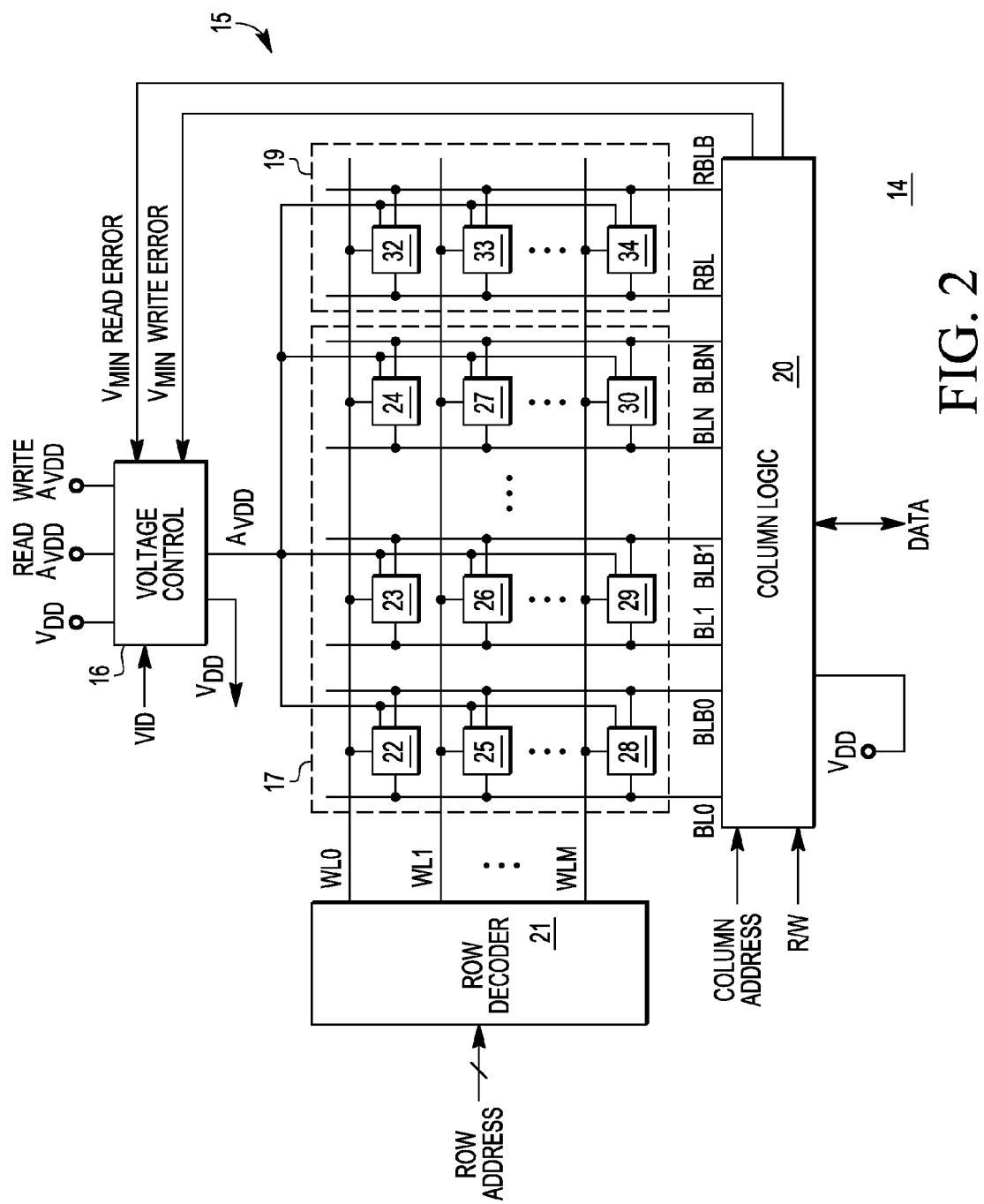
FIG. 2 illustrates, in block diagram form, the memory of FIG. 1 in more detail.

FIG. 2 illustrates, in partial block diagram form and partial logic diagram form, memory 14 of FIG. 1 in more detail. Memory 14 includes memory array 15, row decoder 21, column logic 20, and voltage control circuit 16. Memory array 15 includes a normal array 17 and a redundant array 19. Normal array 17 is illustrated with representative memory cells 22-30. Redundant memory array 19 is illustrated as one column of memory cells. Other embodiments may have more than one column of redundant memory cells, or one or more rows of memory cells.

The memory cells of normal memory array 17 are organized in rows and columns. A row includes a word line and all of the memory cells coupled to the word line. For example, one row includes word line WL0 and memory cells 22, 23, and 24. Another row includes word line WL1 and memory cells 25, 26, and 27. Another row includes word line WLM and memory cells 28, 29, and 30. A column includes a bit line, or bit line pair, and all of the memory cells coupled to the bit line, or bit line pair. For example, one column includes bit line pair BL0/BLB0 and memory cells 22, 25, and 28. Another column includes bit line pair BL1/BLB1 and memory cells 23, 26, and 29. Another column includes bit line pair BLN/BLBN and memory cells 24, 27, and 30. Redundant memory cells 19 are implemented as a column of memory cells including memory cells 32, 33, and 34 coupled to redundant bit line pair RBL/RBLB in memory array 15. A redundant memory element, such as a row or column, is not generally used unless it is necessary to substitute redundant cells for defective cells. In FIG. 2, the redundant memory cells 19 are illustrated as a representative redundant column. Note that there is generally more than one redundant column in a memory array having redundancy but only one is illustrated in FIG. 2 for the purpose of simplicity. In another embodiment, row redundancy may be used. Redundancy is common in integrated circuit memories and will only be discussed to the extent necessary to describe the present embodiment. In one embodiment, memory cells 22-30 and 32-34 may be conventional six-transistor static random access memory (SRAM) cells. Each cell has a power supply voltage terminal coupled to receive array power supply voltage AVDD. Note that peripheral circuits such as row decoder 21, column logic 20, and voltage control 16 are powered by power supply voltage VDD. In another embodiment, another type of volatile or non-volatile memory cell may be used.

Row decoder 21 includes an input for receiving a multi-bit row address labeled "ROW ADDRESS", and an output coupled to each of the word lines. Row decoder 21 selects one of the word lines WL0-WLM in response to receiving a row address. Note that in the illustrated embodiment, a row stores multiple cache lines or portions of different cache lines for processor 12. In another embodiment, a row may store a single cache line or a portion of a single cache line in which case a column address and column multiplexers would not be used. Column logic 20 includes column multiplexers, sense amplifiers, bit line loads, write drivers, precharge and equalization circuits, input/output (I/O) circuits, and the like. Column logic 20 is coupled to each of the bit line pairs of normal array 17 and redundant array 19. During a read operation of memory 14, a control signal labeled "R/W" is asserted at a predetermined logic state, for example, a logic high to place memory 14 in a read functional operating mode. A row address selects one of the word lines causing a stored logic state of each of the memory cells to be provided to a corresponding bit line pair in the form of a differential voltage. The column multiplexers (not shown) of column logic 20 select one group of a plurality of column groups to couple to the sense amplifiers based on the column address. For example, in one embodiment, a 4-to-1 column multiplexer may be implemented where one in four columns is selected by the column multiplexers for coupling to the sense amplifiers or write drivers. The sense amplifiers of column logic 20 sense and amplify the differential voltages and corresponding signals are output from column logic 20 as data signals labeled "DATA". A write operation is essentially the opposite of a read operation. That is, control signal R/W is negated as, for example, a logic low, and data signals DATA are provided via write drivers to memory cells coupled to a word line selected by the row address.

Column logic 20 includes circuits for detecting an error in the designated test cell of memory array 15 and for generating error signals labeled "VMIN READ ERROR" and "VMIN WRITE ERROR" in the event an error is detected. In one embodiment, the error is caused by operating memory array 15 at too low a power supply voltage. For example, in the case where memory array 15 is an SRAM array, reading a memory cell when the power supply voltage is too low may cause the memory cell to unintentionally change logic states. Conversely, writing to a memory cell when the power supply voltage to the cell is too high, may prevent the logic state from changing. Note that redundancy is first implemented in array 15 to correct for "hard" failures in the memory array. Hard failures can be opens, shorts, or other errors that prevent the memory cell from functioning regardless of the power supply voltage. Another test is performed to detect the voltage VMIN for each cell. This test may be performed using BIST circuit 18 (FIG. 1). In one embodiment, the cell with the highest VMIN is the weakest cell and is designated as the test cell. In another embodiment, for guard banding purposes, another cell that is weak, but not the weakest cell, is designated as the test cell.

Note that in one embodiment, WRITE AVDD may be a fixed voltage of about 0.7 volts, READ AVDD may be a fixed voltage of about 1 volt, and VDD may be variable between about 1 volt and 0.75 volts. During a read operation that requires a higher read assist power supply voltage, as determined by testing the designated test cell, power supply voltage READ AVDD is provided by voltage control 16 as memory array power supply voltage AVDD to supply voltage terminals of each of the memory cells of array 15. Likewise, if during a write operation, it is determined by testing the test cell that assistance is required to reliably write to the memory array, write assist power supply voltage WRITE AVDD is provided by voltage control 16 as power supply voltage AVDD to memory array 15. The use of read assistance does not require the use of write assistance and vice versa. Also, the voltage levels used for WRITE AVDD, READ AVDD, and VDD may be different in other embodiments.

In one embodiment, if it is determined by testing of the test cell that a write assist is required for reliable operation of the memory, instead of providing WRITE AVDD to memory array 15, the write assist operation includes coupling the power supply voltage VDD to memory array power supply AVDD, while a negative voltage is coupled to the selected bit lines. A negative voltage source may provide, for example, −100 to −300 millivolts (mV). Alternately, the negative voltage may be a fraction of an NMOS (N type metal-oxide semiconductor) threshold voltage of a memory cell pass transistor. During the write operation, the negative bit line voltage can assist changing of the stored logic state. The negative voltage may be generated in a number of different ways. For example, the negative voltage can be generated externally to system 10. Also, the negative voltage can be generated on the same integrated circuit as system 10 using a negative boosting charge pump. In addition, the negative voltage can be generated using capacitive bootstrapping. Timing of the application of the negative voltage may be controlled by voltage control 16 in response to the VMIN WRITE ERROR signal. Further, a circuit for generating the negative bit line voltage may be conveniently implemented as part of column logic 20 or voltage control 16.

Figure 3:
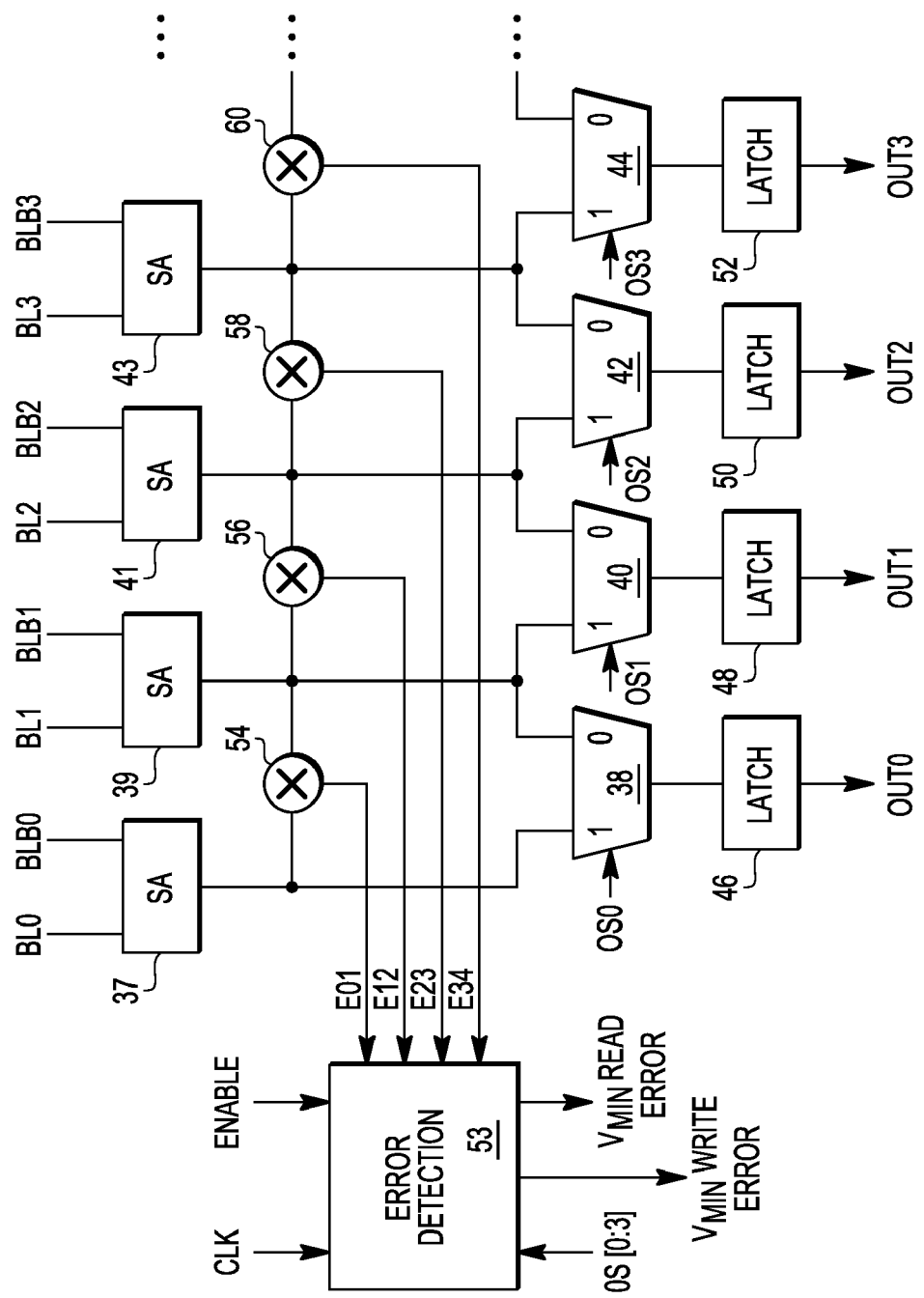
FIG. 3 illustrates, in partial block diagram form and partial logic diagram form, a portion of the column logic of the memory of FIG. 2.

FIG. 3 illustrates, in partial block diagram form and partial logic diagram form, an output portion of the column logic 20 of FIG. 2 in accordance with an embodiment. The portion of column logic and test circuits 20 includes sense amplifiers 37, 39, 41, and 43, two-input multiplexers 38, 40, 42, and 44, latch circuits 46, 48, 50, and 52, comparators 54, 56, 58, and 60, and error detection circuit 53. Each of sense amplifiers 37, 39, 41, and 43 are coupled to a bit line pair, for example, sense amplifier 37 is coupled to bit line pair BL0/BLB0. Note that, as discussed above, in another embodiment, sense amplifiers 37, 39, 41, and 43 may be shared by more than one bit line pair using multiplexing circuits (not shown) and additional decoding. Outputs of sense amplifiers 37, 39, 41, and 43 are coupled to inputs of multiplexers 38, 40, 42, and 44 to allow a defective column to be repaired by shifting non-defective outputs to the left and adding the redundant column at the far right of the array. In another embodiment the replacement of defective memory cells may be accomplished differently. Depending on the embodiment, the sense amplifiers may provide a differential output or a single-ended output. Each of the multiplexers is controlled using a control signal provided by an output select control signal generated by a memory controller (not shown) which is either internal or external to memory 15. For example, multiplexer 38 receives output select control signal OS0, multiplexer 40 receives output select control signal OS1, multiplexer 42 receives output select control signal OS2, and multiplexer 44 receives output select control signal OS3. Output select control signals, including control signals OS0-OS3, are provided by memory controller and BIST 20 during a normal read operation or during a test operation to choose which bit line pair is to be coupled to which output latch. Outputs of multiplexers 38, 40, 42, and 44 are coupled to inputs of latches 46, 48, 50, and 52, respectively. Output signals OUT 0, OUT 1, OUT 2, and OUT 3, are provided by outputs of latches 46, 48, 50, and 52, respectively. Output signals OUT 0, OUT 1, OUT 2, and OUT 3 represent the output portion of bidirectional DATA signals illustrated in FIG. 2.

A comparator is coupled between the outputs of adjacent sense amplifiers. For example, comparator 54 has an input coupled to the output of sense amplifier 37, and an input coupled to the output of sense amplifier 39, and an output for providing a comparison result labeled "E01". Comparator 56 has an input coupled to the output of sense amplifier 39, and an input coupled to the output of sense amplifier 41, and an output for providing a comparison result labeled "E12". Comparator 58 has an input coupled to the output of sense amplifier 41, and an input coupled to the output of sense amplifier 43, and an output for providing a comparison result labeled "E23". Comparator 60 has an input coupled to the output of sense amplifier 43, and an input coupled to the output of another sense amplifier (not shown) adjacent to sense amplifier 43, and an output for providing a comparison result labeled "E34", where the other comparator is not shown. Note that four comparators are shown for illustration purposes; the number of comparators depends on the number of columns in the array. Each comparison result signal (E01, E12, E23, E34) is provided to an input of error detection circuit 53. In another embodiment, the placement and connection of comparators 54, 56, 58, and 60 with respect to sense amplifiers 37, 39, 41, and 43 may be different.

The circuitry of FIG. 3 allows the designated test cell to be tested during a functional operating mode of memory 14 anywhere within memory array 15. During a test mode, a predetermined pattern of bits, such as for example, all ones, all zeros, a checkerboard pattern, or the like, are written to the memory array while the array is powered using predetermined power supply voltages. Each memory cell is then read and the output bit is then compared to an adjacent bit. When a weak bit is located, the comparison result (E01 through E34 of FIG. 3) is output as well as the address of the weak bit to error detection circuit 53. If either all ones or all zeros are written to the memory array 15, a logic "1" output from any of comparators 54, 56, 58, or 60 indicates a weak bit failure has been detected. If a checkerboard pattern is written to memory array 15, a logic "0" output from any of comparators 54, 56, 58, or 60 indicates a weak bit failure has been detected. The test can be done real-time during a functional operating mode, during a pre-scheduled time, such as for example, at power-on or power-on reset (POR), or during a BIST operating mode. After a weak, or weakest, bit is detected, it is designated as the test bit. The test bit is not used as a normal bit of the array. Redundancy is used to substitute a redundant cell for the designed test cell. In the illustrated embodiment, a redundant column, such as column 19, is substituted for the column having the designated test bit.

When the power supply voltage is changed, a stored logic state of the designated test cell, or bit, is compared to another bit of the array that is not a "weak" bit. The designated test cell is used to predict when memory operation will become unreliable because of an inadequate power supply voltage. The output of the comparison is used to determine if the memory cells of the array have an adequate operating margin at the new power supply voltage. Note that the array voltage may be lowered for power conservation or increased for better performance. The testing of the test bit can be accomplished at various times and during various operating modes when the power supply voltage is changed. Note that in other embodiments, the placement and connection of two-input multiplexers 38, 40, 42, and 44 with respect to outputs of sense amplifiers 37, 39, 41, and 43 may be accomplished differently.

FIG. 4 illustrates a flow chart of a method 70 for testing memory 14 in accordance with an embodiment. The method begins after the memory is tested for hard failures, as discussed above, and redundancy has been used to correct for failed cells. If there are no redundant columns available, method 70 is not performed. Assuming at least one redundant element is available, at step 72, memory 14 is tested for VMIN weak cells, the weakest cells are identified, and a redundant element, such as a redundant column, is substituted for the weak cell. At step 74, the weakest cell becomes a test cell and is used for testing purposes only. As discussed above, the weakest cell may not provide enough guard band, or voltage margin, to guarantee reliable operation. In this case, another weak cell, but not the weakest cell, is designated to be the test cell. BIST 18 may be used for the VMIN weak bits test. In one embodiment, the memory cells are tested by performing read and/or write operations while lowering the power supply voltage. The memory cell that fails at the highest power supply voltage is the weakest cell. At decision step 76, it is determined if a request for a power supply voltage change is received. Typically, a processor in the system, such as processor 12 (FIG. 1), requests the power supply voltage change for purposes of performance or reduced power consumption. The NO path is taken from step 76 back to the beginning of step 76 until a request is detected. When a request for a power supply change is detected, the YES path is taken to step 78. At step 78, a test of the designated test cell is performed at the new requested power supply voltage. The test may be performed while memory 14 is still in a functional mode, in the background, using the circuits of FIG. 3 as discussed above. If, at decision step 80, the designated test cell operates correctly at the new power supply voltage, it is assumed that all of the cells of memory array 15 will operate correctly and the YES path is taken from decision step 80 to step 82. At step 82, the new power supply voltage NEW VDD becomes power supply voltage VDD (FIG. 2). At step 84, the memory array is operated at the new power supply voltage and the method returns to decision step 76. If the test cell fails testing at the new power supply voltage, the NO path is taken from step 80 to step 86. At step 86, either the write assist voltage operation is enabled, or the read assist voltage operation is enabled, or both are enabled. During a write operation using a write assist operation, the write assist power supply voltage WRITE AVDD is provided by voltage control 16 to memory array 15 to increase the write margin. Alternately, the bit line voltage may be changed to a negative voltage as discussed above. Likewise, during a read operation using a read assist operation, the read assist power supply voltage READ AVDD is provided by voltage control 16 to memory array 15 to increase the read margin. At step 88, the test cell is tested using one or both of the power supply voltages READ AVDD and WRITE AVDD. Alternately, the write and read assist operations may be applied without further testing because the memory array may have been previously determined to operate reliably while applying the write and/or read assist operations. At decision step 90, if the test cell failed the tests using write and/or read assist, then the memory cannot be operated at the requested power supply voltage (step 92). The power supply voltage of the array may then be returned to the previous voltage level. If the test cell passed testing using read and/or write assist power supply voltages, the YES path is taken to step 82 and the method is continued as described above.

Alternately, at step 86, a write assist operation may include applying power supply voltage VDD to the memory cell power supply AVDD while also applying a negative bit line voltage to the addressed, or selected, bit lines for the write operation. As discussed above, a magnitude of the negative voltage may be a fraction of a threshold voltage of an NMOS pass transistor of the memory array. The negative bit line voltage assists changing of the logic state stored by the memory cell's cross-coupled pair of invertors. The above described access assist operations can be applied in various ways. For example, in one embodiment, the read and write assist techniques can be applied to a portion of the memory cells in memory array 15 instead of the whole array.

Method 70 provides a method for accessing a memory reliably at reduced power supply voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing system, this exemplary system is presented merely to provide a useful reference in discussing various aspects of the invention. Of course, the description of the system has been simplified for purposes of discussion, and it is just one of many different types of appropriate systems that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the system depicted herein is merely exemplary, and that in fact many other systems can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, memory 14 may be located on a same integrated circuit as processor 12 or on a separate integrated circuit or located within another peripheral or slave discretely separate from other elements of system 10.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
testing, using a first test, a plurality of static random access memory elements to determine a lowest power supply voltage at which all the plurality of memory elements will operate;
determining a weak memory element of the plurality of static random access memory elements;
substituting a portion of a plurality of redundant static random access memory elements for a portion of the plurality of static random access memory elements that includes the weak memory element;
designating the weak memory element to be a test element;
supplying the plurality of static random access memory elements with a first power supply voltage;
receiving a request for a change of the first power supply voltage to a second power supply voltage;
in response to receiving the request, testing, using a second test, the test element to determine if the test element will function correctly at the second power supply voltage,
if the test element passes the second test, accessing the plurality of static random access memory elements at the second power supply voltage, and
if the test element fails the second test, accessing the plurality of static random access memory elements using an access assist operation.

2. The method of claim 1, wherein the weak memory element is one of either a memory cell, a plurality of memory cells, a row of memory cells, and a column of memory cells.

3. The method of claim 1, wherein the access assist operation comprises one of either using the first power supply voltage during the accessing of the plurality of memory elements, accessing the plurality of memory elements using a predetermined power supply voltage determined using the first test, applying a negative voltage to a bit line during the accessing of the plurality of memory elements, and applying a third power supply voltage determined during a third test during the accessing of the plurality of memory elements.

4. The method of claim 3 wherein accessing the plurality of memory elements at the third power supply voltage further comprises providing the third power supply voltage for only for the duration of the access.

5. The method of claim 3, wherein the first test is characterized as being a built-in self test, and the second and third tests are characterized as being performed during a functional operating mode of the plurality of memory elements.

6. The method of claim 1, wherein substituting the portion of the plurality of redundant memory cells for the portion of the plurality of memory cells that includes the weak memory element further comprises substituting a column of the plurality of redundant memory elements for a column of the plurality memory elements that includes the weak memory element.

7. The method of claim 1, wherein designating the weak memory element to be a test element further comprises using the test element only during the second test.

8. The method of claim 1, further comprising supplying the plurality of memory elements with the second power supply voltage after the access is complete.

9. The method of claim 1, wherein the plurality of memory elements are characterized as being part of an embedded memory in a single-chip data processing system.

10. A method for accessing a memory array comprising:
implementing redundancy in the memory array to substitute a redundant memory cell for a failed memory cell;
testing, using a first test, the memory array to determine a lowest power supply voltage at which all memory cells of the memory array will operate;
determining a weak memory cell of the memory array;
substituting a redundant memory cell for the weak memory cell;
designating the weak memory cell to be only a test cell;
supplying the memory array with a first power supply voltage;
receiving a request for a change of the first power supply voltage to a second power supply voltage;
in response to receiving the request, testing, using a second test, the test cell to determine if both read and write operations can be performed correctly on the test cell at the second power supply voltage,
if the test cell passes the second test, accessing the memory array at the second power supply voltage, and
if the test cell fails the second test, providing a third power supply voltage to the test cell and testing the test cell using a third test to determine if the test cell will function correctly at the third power supply voltage; and
if the test cell passes the third test, accessing the memory array at the third power supply voltage.

11. The method of claim 10, wherein the second and third power supply voltages are generated on a same integrated circuit as the memory array.

12. The method of claim 10, wherein substituting a redundant memory cell for the weak memory cell further comprises substituting a redundant column of memory cells for a column of memory cells having the weak memory cell.

13. The method of claim 10, wherein the plurality of memory cells comprises a plurality of static random access memory cells.

14. The method of claim 10 wherein accessing the memory array at the third power supply voltage further comprises providing the third power supply voltage for only for the duration of the access.

15. The method of claim 10, wherein the plurality of memory cells are characterized as being part of an embedded memory in a single-chip data processing system.

16. An integrated circuit comprising:

a memory array comprising a plurality of static random access memory cells organized in rows and columns, wherein a memory cell of the plurality of static random access memory cells is designated as a test memory cell;

a plurality of redundant static random access memory cells for implementing redundancy in the memory array, wherein a redundant memory cell of the plurality of redundant static random access memory cells is used to substitute for the test memory cell during operation of the integrated circuit;

an error detection circuit, coupled to the memory array, for detecting a failure of the test memory cell concurrently with an access to a memory cell of the plurality of static random access memory cells; and a voltage control circuit, coupled to the memory array and to the error detection circuit, for activating an access assist operation in response to the error detection circuit detecting a failure of the test memory cell, wherein the access assist operation comprises one of either using a first power supply voltage during a write operation of the plurality of static random access memory elements at which the test memory cell functions correctly, applying a negative voltage to a bit line during the write operation of the plurality of static random access memory elements, and applying a second power supply voltage determined during a read operation of the plurality of static random access memory elements.

17. The integrated circuit of claim 16, wherein the test memory cell is characterized as being a memory cell of the memory array that operates unreliably at a relatively high power supply voltage.

18. The integrated circuit of claim 16, wherein the error detection circuit provides an access error signal to the voltage control circuit in response to detecting the failure of the test memory cell, and wherein the voltage control circuit changes one of either the power supply voltage to the memory array or a bit line voltage in response to the access error signal.

19. The integrated circuit of claim 16, wherein the voltage control circuit comprises a comparator having a first input coupled to a first bit line, a second input coupled to a second bit line, and an output coupled to an input of the error detection circuit.

\* \* \* \* \*